(12) United States Patent
Brodsky et al.

(10) Patent No.: US 7,248,455 B2
(45) Date of Patent: Jul. 24, 2007

(54) METHOD AND APPARATUS FOR PROVIDING COMPRESSIVE CONNECTION WITH ELECTROSTATIC DISCHARGE DISSIPATIVE PROPERTIES

(75) Inventors: William L. Brodsky, Binghamton, NY (US); Icko E. Iben, Santa Clara, CA (US); Ho-Yiu Lam, Mountain View, CA (US); George G. Zamora, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 635 days.

(21) Appl. No.: 10/698,740

(22) Filed: Oct. 31, 2003

(65) Prior Publication Data

US 2005/0095884 A1    May 5, 2005

(51) Int. Cl.
*H02H 9/00*    (2006.01)
(52) U.S. Cl. .......................... 361/220; 361/56
(58) Field of Classification Search ............. 361/56, 361/220
See application file for complete search history.

(56) References Cited

U.S. PATENT DOCUMENTS

| | | | |
|---|---|---|---|
| 5,059,129 A | 10/1991 | Brodsky et al. | 439/67 |
| 5,873,740 A | 2/1999 | Alcoe et al. | 439/67 |
| 5,947,750 A | 9/1999 | Alcoe et al. | 439/67 |
| 5,947,753 A | 9/1999 | Chapman et al. | 439/79 |
| 6,540,528 B2 | 4/2003 | Brodsky et al. | 439/67 |
| 6,722,895 B1 * | 4/2004 | Brodsky et al. | 439/67 |
| 2001/0018295 A1 | 8/2001 | Fasold et al. | 439/676 |

OTHER PUBLICATIONS

NF Nilsen, "Electrostatic Eliminators for Connector Cables," Research Disclosure, n279, Jul. 1987.

* cited by examiner

*Primary Examiner*—Stephen W. Jackson
(74) *Attorney, Agent, or Firm*—David W. Lynch; Chambliss, Bahner & Stophel PC

(57) ABSTRACT

A method and apparatus for providing compressive connection with electrostatic discharge dissipative properties is disclosed. A compression connector is formed having an elastomeric material modified to provide a dissipative member, an electrostatically dissipative base member, and a connection to a ground to dissipate the charge generated when tension is applied to or released from the elastomer.

20 Claims, 7 Drawing Sheets

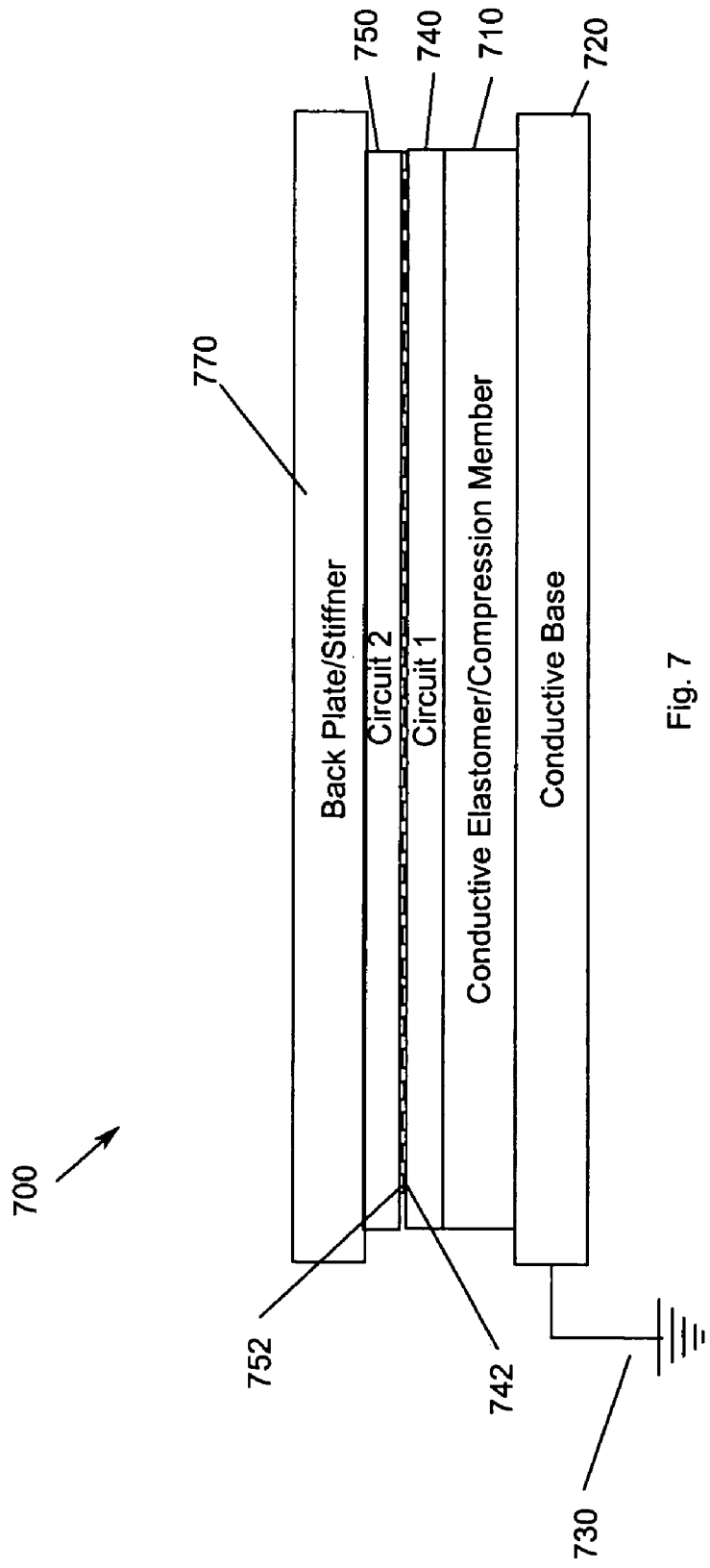

METHOD AND APPARATUS FOR PROVIDING COMPRESSIVE CONNECTION WITH ELECTROSTATIC DISCHARGE DISSIPATIVE PROPERTIES

BACKGROUND OF THE INVENTION

1. Field of the Invention

This invention relates in general to electrical connectors, and more particularly to a method and apparatus for providing compressive connection with electrostatic discharge dissipative properties.

2. Description of Related Art

Magnetic head-based systems have been widely accepted in the computer industry as a cost-effective form of data storage. In a magnetic disk drive system, a magnetic recording medium in the form of a disk rotates at high speed while a magnetic read/write transducer, referred to as a magnetic head, "flies" slightly above the surface of the rotating disk. The magnetic disk is rotated by means of a spindle drive motor. The magnetic head is attached to or formed integrally with a "slider" which is suspended over the disk on a spring-loaded support arm known as the actuator arm. As the magnetic disk rotates at operating speed, the moving air generated by the rotating disk in conjunction with the physical design of the slider lifts the magnetic head, allowing it to glide or "fly" slightly above and over the disk surface on a cushion of air, referred to as an air bearing. The flying height of the magnetic head over the disk surface is typically only a few tens of nanometers or less and is primarily a function of disk rotation, the aerodynamic properties of the slider assembly and the force exerted by the spring-loaded actuator arm.

In a magnetic tape drive system, a magnetic tape typically containing data tracks that extend along the length of the tape is drawn across magnetic tape heads. The magnetic tape heads can record data (with writing elements or writers) and read data (with read elements or readers) as relative movement occurs between the heads and the tape.

A major problem that is encountered during manufacturing, handling and use of magnetic recording transducers, referred to as heads, is the buildup of electrostatic charges on the various elements of a head or other objects which come into contact with the heads, particularly sensors of the thin film type, and the accompanying spurious discharge of the static electricity thus generated. Static charges may be produced whenever two materials are rubbed against one another. If the static charges are dissipated through the MR sensors, the sensors will heat up. If the sensor temperature is sufficiently high, it can be damaged magnetically or physically. If the changes to the sensor properties are minimal or reversible, then the process is called electrostatic overstress (EOS). If the changes to the sensor properties are irreversible, then the process is called electrostatic damage (ESD).

Magnetoresistive (MR) sensors, also referred to as "MR readers", are particularly useful as read elements in magnetic heads, especially at high data recording densities. The MR sensor provides a higher output signal than an inductive read sensor. This higher output signal results in a higher signal-to-noise ratio for the recording channel and allows higher a real density of recorded data on a magnetic surface of the media.

As described above, when a sensor is exposed to electrostatic discharge or even a voltage or current input larger than that intended under normal operating conditions, the sensor and other parts of the head may be damaged. This sensitivity to electrical damage is particularly severe for MR read sensors because of their relatively small physical size. For example, an MR sensor used for extremely high recording densities will have a current carrying cross-sectional area of the order of 100 Angstroms (Å) by 1.0 micrometers ($\mu$m) or even smaller and lengths of the order of 1 to 10 $\mu$m. Discharge of voltages of only a few volts through such a physically small sensor, behaving like a resistor, are sufficient to produce current densities capable of severely damaging or completely destroying the MR sensor. The nature of the damage which may be experienced by an MR sensor varies significantly, including complete destruction of the sensor via melting and evaporation, resulting in an open circuit or a short or oxidation of the air bearing surface, and milder forms of physical or magnetic damage in which the head performance may be degraded.

The static build up of charge on materials used in the manufacturing of tape or disk drive heads should be avoided to minimize the potential of EOS or ESD damage to the heads.

Flexible cables are often used to electrically interconnect electrical devices such as circuit boards in an assembly, connectors on a circuit board, and other electrical devices that may experience relative motion. Flex strips are generally well-known in the art as multiple flat electrical conductors usually laid out in parallel strips and encased in a flexible, nonconductive material. The resulting flexible electrical interface, i.e., the flex strip, can be bent and twisted within limits. Often, electrical connection means are provided at either end of the conductive strip. For example, contact pads may be formed at the ends of the individual constructive strips and held in contact with mating contact pads on the electrical device.

Heads used in tape drives predominately use flexible cables which allow for electrical contact between the elements in the head and the external electrical circuits uses to communicate with the head and read signals from the head which are generated while reading magnetic information written onto the storage media (magnetic coated tape in particular). A means must be used to connect the electrical contacts in the flexible cable on the head with the external electronics devices. In particular, one type of compression connector used with MR heads used in tape storage drives. The compressive connector can be repeatably releasable, allowing testing of the MR heads during manufacturing or interchange in a product drive. The flexible cable will, in generally, have a plurality of electrical contacts on a surface of the cable. A matching circuitized flexible substrate is provided having electrical contacts on a facing surface that are arranged to match electrical contacts on the flexible cable when in a face-to-face relationship. An elastomeric compression element, which has a plurality of protruding compression members, is positioned at a rear surface of the matching circuitized flexible substrate with the protruding compression members facing and in contact with the rear surface, such that individual compression members are registered with corresponding individual electrical contacts. Elongated electrical contacts are registered with two adjacent individual compression members and a reference plate supports the elastomeric compression element. The electrical contacts are registered in face-to-face relation with matching electrical contacts of the circuitized flexible substrate and a force is exerted normal to the facing surface of the matching circuitized flexible substrate. The normal force causes compression of the elastomeric compression element between the matching circuitized flexible substrate and the reference plate to create non-wiping contact between the electrical contacts of the flexible cable substrate and the electrical contacts of the matching circuitized flexible substrate, thereby forming a releasable, repeatable electrical connection therebetween.

However, materials currently used in compressive connectors include a rubber material encased in a hard plastic, both of which are insulators. When pressure is applied to the rubber material, the rubber material charges up substantially. For example, the elastomer may routinely charge up to 1000 volts when pressure is applied or removed from the compression connection. This charge can result in damage to the sensitive electrical circuits for which the compression connection is used through ESD or EOS.

It can be seen then that there is a need for a method and apparatus for providing a compressive connection with electrostatic discharge dissipative properties.

SUMMARY OF THE INVENTION

To overcome the limitations in the prior art described above, and to overcome other limitations that will become apparent upon reading and understanding the present specification, the present invention discloses a method and apparatus for providing compressive connection with electrostatic discharge dissipative properties.

The present invention solves the above-described problems by forming a compression connector having an elastomeric material modified to provide a dissipative member, an electrostatically dissipative base member, and a connection to a ground to dissipate the charge generated when tension is applied to or released from the elastomer.

A compression connector in accordance with an embodiment of the present invention includes a conductive compression member including a predetermined composition of conductive material and an elastomeric material and an electrostatically dissipative base member including a conductive material for dissipating charge developed on the conductive compression member.

In another embodiment of the present invention, a storage device is provided. The storage device includes a storage element, an electronics assembly, operatively coupled to the storage element, for processing electrical signals for enabling storage of data on the storage element, a magnetic transducer, a cable for providing a signal path between the magnetic transducer and the electronics assembly and a compression connector having electrostatic discharge dissipative properties, the compression connector compressively engaging the cable and the electronics assembly, the compression connector further including a conductive compression member including a predetermined composition of conductive material and an elastomeric material and an electrostatically dissipative base member including a conductive material for dissipating charge developed on the conductive compression member.

In another embodiment of the present invention, a method for forming a compressive connection with electrostatic discharge dissipative properties is provided. The method for forming a compressive connection with electrostatic discharge dissipative properties includes forming a conductive compression member including a predetermined composition of conductive material and an elastomeric material and forming an electrostatically dissipative base member, coupled to the conductive compression member, the electrostatically dissipative base member including a conductive material for dissipating charge developed on the conductive compression member.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 7 is a side view of a compressive connector with electrostatic discharge dissipative properties according to an embodiment of the present invention.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for providing compressive connection with electrostatic discharge dissipative properties. A compression connector is formed having an elastomeric material modified to provide a dissipative member, an electrostatically dissipative base member. A connection to a ground may be provided to dissipate the charge generated when a compressive force is applied to or released from the elastomer.

Figure 1:
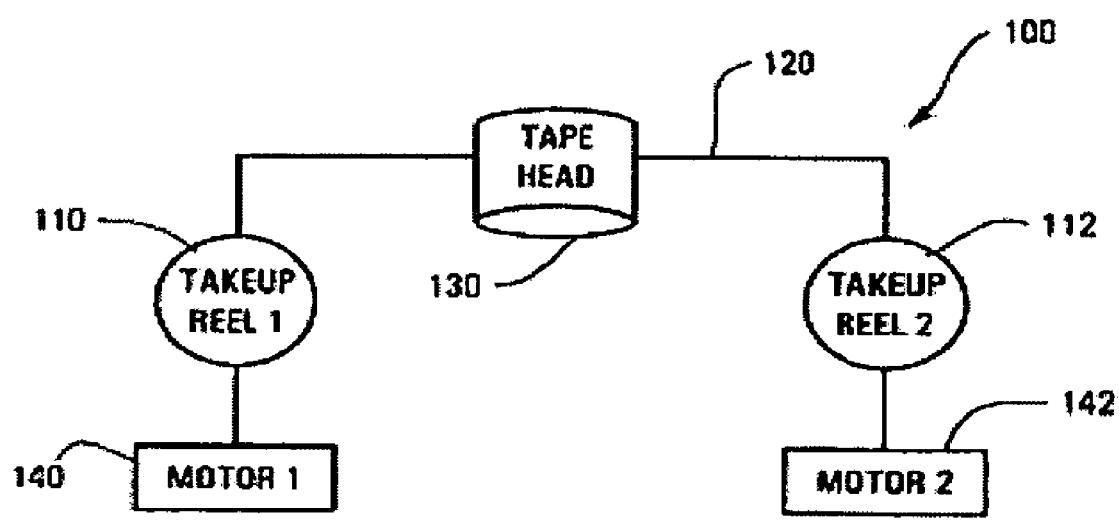
FIG. 1 illustrates a tape system according to an embodiment of the present invention.

FIG. 1 illustrates a tape system 100 according to an embodiment of the present invention. The tape system 100 includes a first supply and a second take-up reel 110, 112. Magnetic recording tape 120 is spooled on the first and second take-up reels 110, 112. The magnetic recording tape 120 is routed over a tape read/write head 130 for reading and writing data on the magnetic recording tape 120. Take-up reel motors 140, 142 control the movement of the magnetic recording tape 120 over the tape read/write head 130.

Figure 2A:
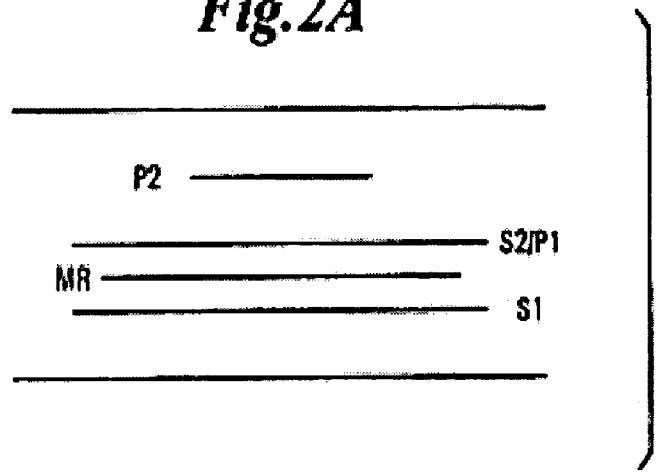
FIG. 2A is a simple diagram of a merged (reader-writer) head.

Many modern tape recording systems require operation where writing and reading of the data occurs for either direction of tape travel. The streaming tape system where the recording is laid down on the tape for alternate directions of tape travel is an example of such a bi-directional recording system. Piggyback (or merged) magnetoresistive read and inductive write element structures have been used in DASD (direct access storage devices; i.e., hard disk) recording heads. FIG. 2A is a simple diagram of a merged head. In FIG. 2A, the MR element is shown disposed between the first shield (S1) and the second shield (S2). The second shield also acts as a first pole (P1) for an inductive write head that is completed with the second pole (P2). Either merged or side-by-side read and write elements are used in a read-after-write application such as described herein for magnetic tape application. Because of the problems that occur with signal feedthrough from a writer, which is adjacent to a reader and the linear motion of tape, (disk media rotates) the reader-writer pairs must be separated by a large distance. Thus, even if merged reader-writer pairs are built into the device, a second set of merged elements will be in a companion module for read-while-write.

Figure 2B:
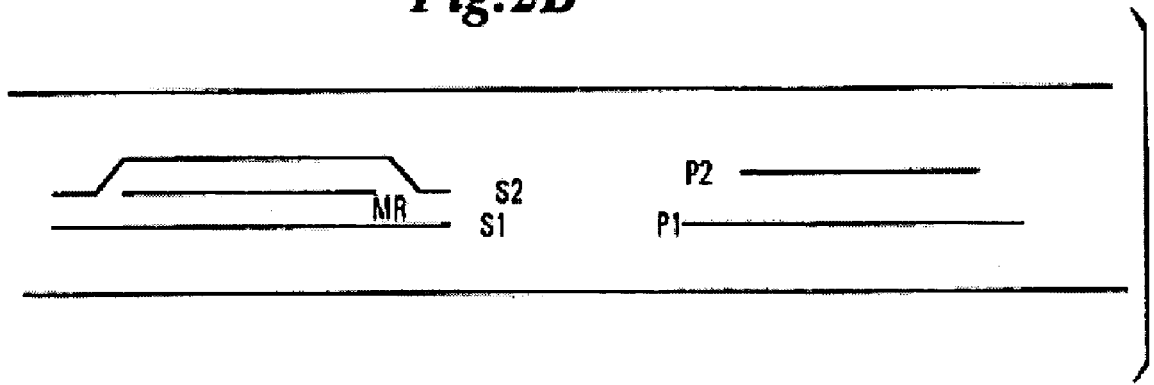
FIG. 2B is a simple diagram of a side-by-side (reader-writer) head.

Incorporation of read-while-writing capability for bi-directional operation has traditionally necessitated a head assembly consisting either of: a first read element adjacent to a write element which is adjacent to a second read element or a side-by-side head which is shown in FIG. 2B. FIG. 2B is a simple diagram of a side-by-side head. In FIG. 2B, the MR read head is shown to the left and includes the MR element and a first and second magnetic shield. The write head is formed beside the read head; here to the right of the MR read head. The write head is formed by the first and second poles.

Figure 3:
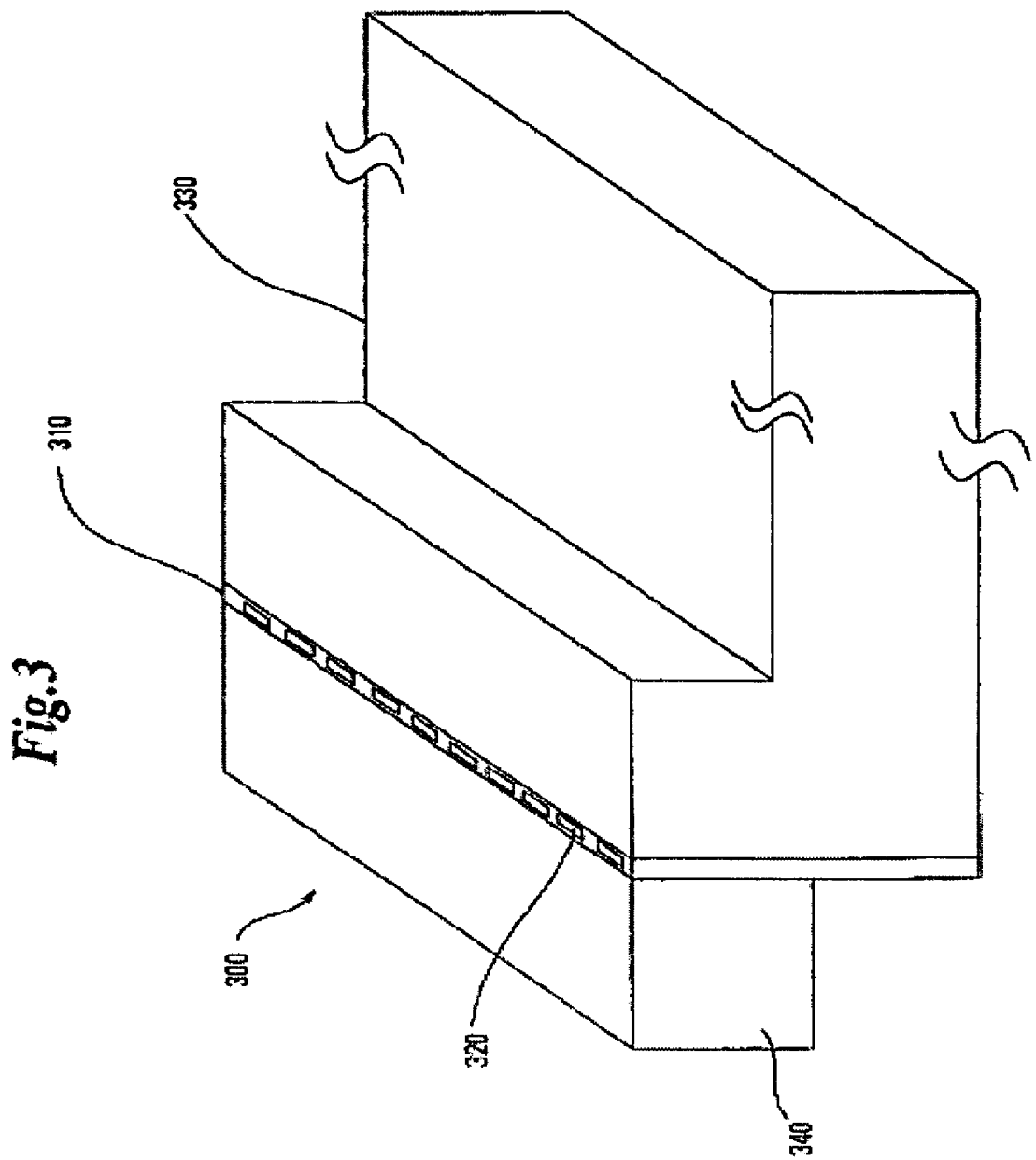
FIG. 3 illustrates one module of a read-while-write tape head with a multiplicity of readers and writers according to an embodiment of the present invention.

A read-while-write head assembly comprises a write element in-line with a read element along the direction of tape motion. The lateral alignment of the width of the read and write elements is maintained to a high tolerance. FIG. 3 illustrates one module of a read-while-write head 300 containing a multiplicity of read and write elements according to an embodiment of the present invention. In FIG. 3, the layers 310 for the read-while-write transducer elements 320 are deposited on a substrate 330. The substrate 330 is separated from a closure 340 by the plurality of layers 310 forming the read-while-write transducers 320.

Figure 4:
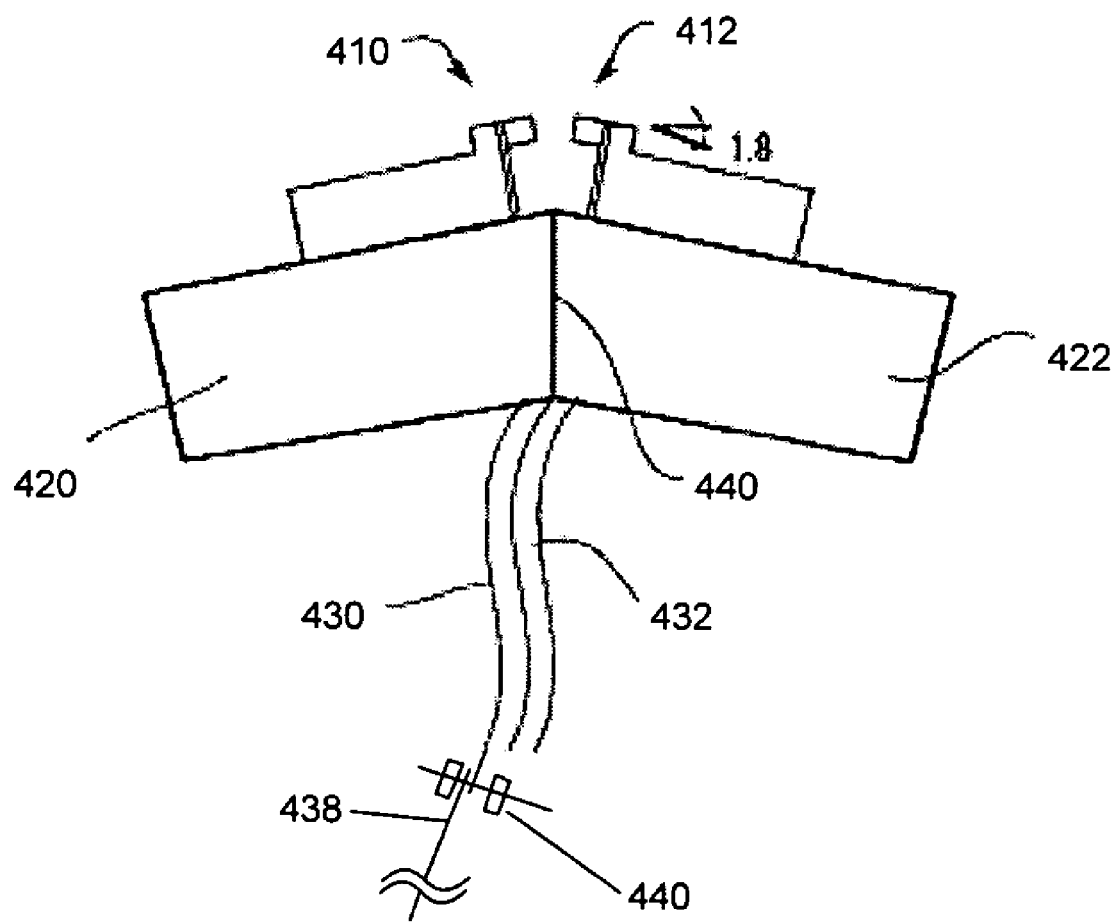
FIG. 4 illustrates a side view of the tape head assembly according to an embodiment of the present invention.

FIG. 4 illustrates a side view of the tape head assembly 400 according to an embodiment of the present invention. A tape head is fabricated with two such modules, with a writer of module 1 (up-stream to tape motion) being aligned to a reader in module 2 (down-stream) and forming a writer-reader pair. In FIG. 4, the tape head assembly 400 includes a read-after-write pair of magnetic recording modules 410, 412 attached to two rigid, precision U-shaped support beams 420, 422. Wafer processed thin film tape heads 410, 412 are fabricated and bonded to the top surfaces of the U-beams 420, 422. Cables 430, 432 are electrically attached to the heads 410, 412 and may be bonded to the U-beams 420, 422 for strain relief in the region between the legs. The cabled beams 420, 422 are then positioned with the end surfaces 440 of the legs of one in close proximity to those of its companion. Critical height, wrap angle and track-to-track alignments are performed. Finally, the beams are bonded together using a joining agent in the narrow gap between the ends of the legs. The required tolerances for tape wrap angle setting, track-to-track registration, and head-to-head parallelism are achieved by minimizing relative motion of the two halves during joining agent setting, because lateral forces exerted by the joining agent are generally small and the horizontal component tends to cancel, as there are two legs. Metal wires pass through the cables 430, 432 from the reader and writer elements 410, 412 to the distal ends of the cables 430, 432 where the ends are attached to external electrical components 438, such as detector electronics mounted on a printed circuit board (PCB) in the tape drive. In FIG. 4, the connection to cables 430 is a compressive connector 440 according to an embodiment of the present invention.

Figure 5:
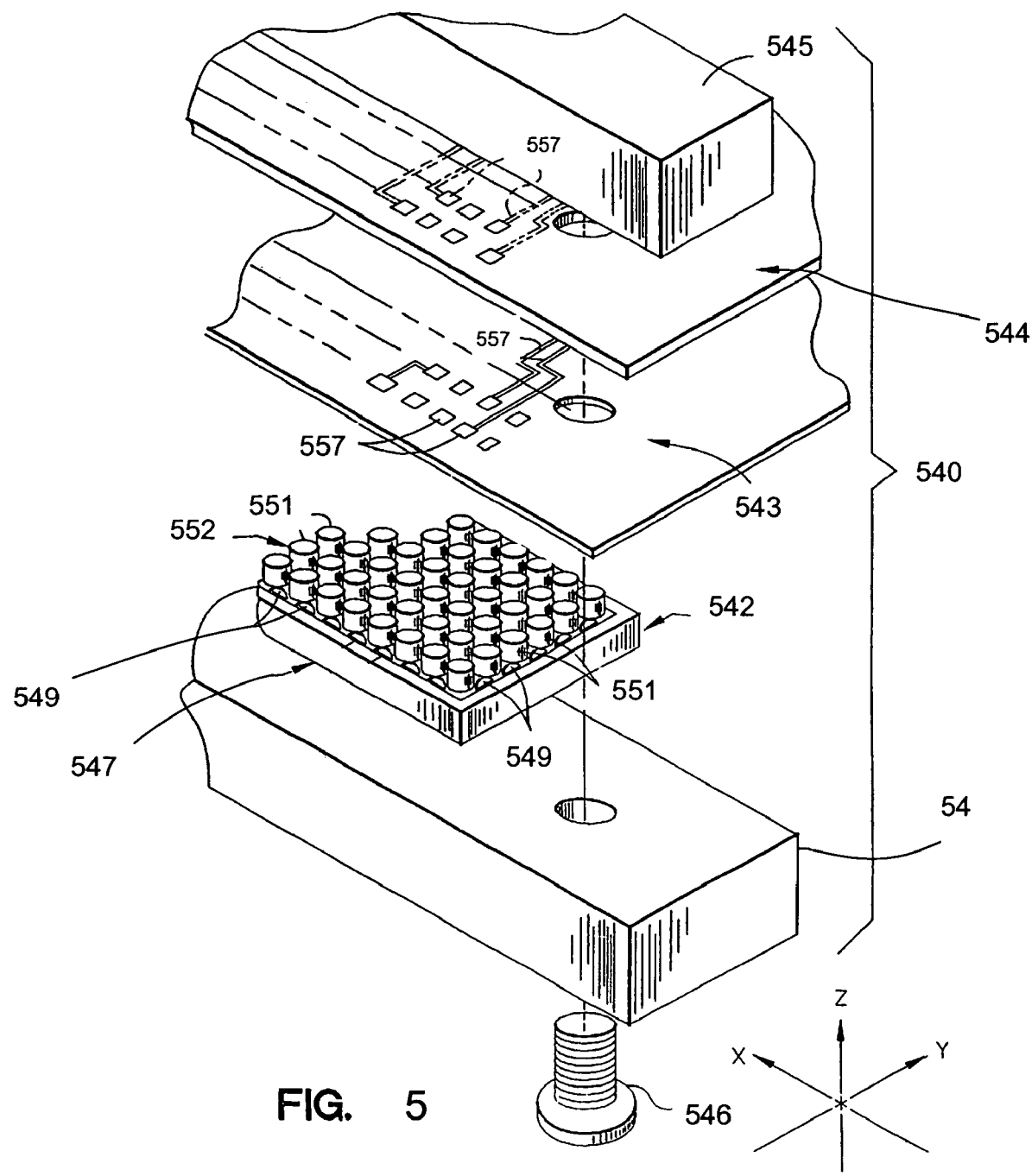
FIG. 5 is a partial, exploded perspective view of an electronic connector assembly including an elastomeric structure in accordance with one embodiment of the invention.

FIG. 5 is a partial, exploded perspective view of an electronic connector assembly including an elastomeric structure in accordance with one embodiment of the invention. In FIG. 5, an electrical connector 540 is provided for connecting a flexible cable to an electronics assembly is shown in an exploded view. Connector 540 is comprised of an optional support member 541, an elastomer structure 542, a first circuitized member 544, and a second circuitized member 543. Connector 540 may also include a stiffener 545 and screws 546 (only one shown, but two are preferred). Screws 546 can be used to align the members of the connector assembly and also to maintain the connector in an actuated state. Optional alignment pins for high tolerance alignment of the electrical connection pads in the cable with the external device can also be used, but are not always necessary. Other means, e.g., a clamping apparatus, may be used to provide such actuation. An alternative means would be a form of clamp.

The first and second circuitized members (544, 543) can be made from a glass reinforced/epoxy resin material (FR-4), polyimide film, ceramic, or other materials commonly used in the art. These substrates, in turn, may include having electrically conductive traces (circuitry) 557 made of copper or similarly conductive material thereon. In one embodiment, circuitized member 544 may be comprised of such epoxy resin material and copper circuitry possessing a desired thickness. Member 543 may comprise polyimide with a desired thickness. Members as thin as member 543 may also be referred to as flexible circuit members while the resin dielectric substrate is typical of thicker, more rigid PCBs. Elastomeric structure 542 may include a base member 547 that provides a pattern of upstanding projections 551, which form an elastomeric member 552, and a pattern of openings 549.

Figure 6:
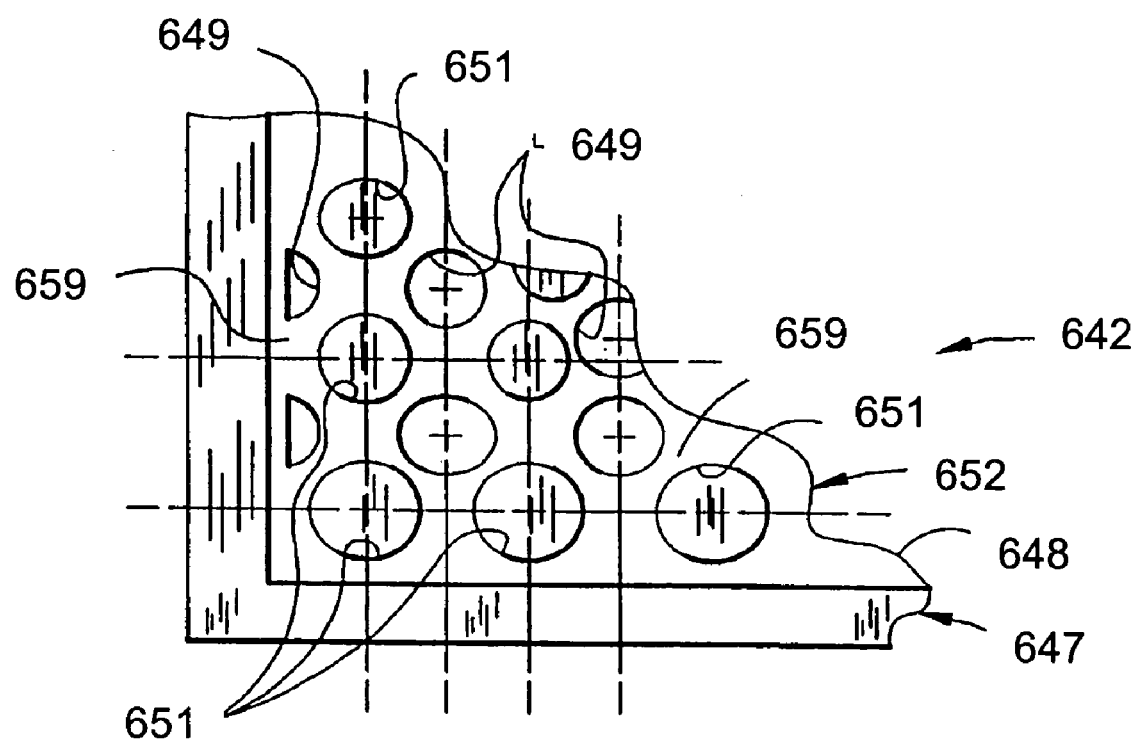
FIG. 6 is a partial top view, on an enlarged scale over FIG. 5, showing a portion of the elastomeric structure shown in FIG. 5.

FIG. 6 is a partial top view, on an enlarged scale over FIG. 5, showing a portion of the elastomeric structure shown in FIG. 5. FIG. 6 shows elastomeric structure 642 having a rigid base member 647 with a pattern of upstanding projections 651 which form an upper layer of an elastomeric member 652 having a pattern of openings 649 in the elastomeric member's base layer 648. The projection pattern may be a substantially rectangular pattern having predetermined center-to-center spacings. However, those skilled in the art will recognize that the present invention is not meant to be limited to rectangular patterns. As seen, the openings 649 located between two adjacent projections 651 each represent a common opening to both adjacent projections. Compressive forces applied to top surface of upstanding projections 651, compress base lay 648 causing opening 649 to reduce in size and top surface 659 of the elastomeric member's layer 648 to laterally displace toward the top surface of upstanding projections 651.

FIG. 7 is a side view of a compressive connector 700 with electrostatic discharge dissipative properties according to an embodiment of the present invention. FIG. 7 shows the elastomeric member 710 and a base member 720. FIG. 7 also shows a ground connection 730 to dissipate the charge generated when tension is applied to or released from the elastomer 710. In FIG. 7, the compression connector 700 is used to compress together metal pads 742, 752 of two circuits 740, 750 to form electrical contact and complete an electrical circuit. For example, in tape heads the two circuits may be the cable for a read/write head and the electrical pads in a PCB, which are located in a tester or a tape drive. The compression member 700 is made from two portions, an elastomeric member 710 that is vulcanized to a rigid, hard base member 720, e.g., conductive plastic. A back plate or stiffner 770 may be provided to allow the elastomeric member 710 and base 720 to apply force to the two circuits 740, 750.

It is desirable for the compressive member 710 to be electrostatically dissipative and not a low resistance (high conductivity) conductor because the compressive member 710 is adjacent to the electrical circuits 740, 750 and may contact the circuits 740, 750. The resistivity of 710 must be low enough to allow dissipation of charges to avoid charge accumulation. Thus, the compressive member 710 should have a sufficiently high resistance to minimize resistive loading on the electrical circuits 740, 750 because the elastomeric member 710 is the portion in physical contact with the circuit members 740, 750. The base member 720 should have a sufficiently high conductance or lower resistance for to insure the charge accumulated on the elastomeric member 710 can be bled to ground 730 through the base member 720. Furthermore, the base member 720 must be in intimate electrical contact with the elastomer member 710. In the case of the present invention, the two members are molded or fused together during formation, thus precluding the need for additional processes such as adhesive bonding with a conductive adhesive. If necessary in some other application, a conductive adhesive could be used. The base member 720 can be more conductive because the base member 720 is electrically separated from the contact pads 742, 752 by the low conductivity elastomer member 710. Furthermore, since contact to 720 by a grounding wire 730 must be made to bleed off charge, it is desirable that the conductivity of the base material be sufficiently high. Adding too high a concentration of conductive material to the base member 720 could adversely affect its mechanical properties, or shrinkage during molding or long-term stability. A concentration of carbon black in the base member 720 of the order of 3% satisfies the constraints on conductivity, mechanical properties and long-term stability.

The force exertion member may be made to be electrostatically dissipative by providing a custom blend for of dissipative material for the elastomer member 710 and/or the base member 720. During the functional life of the compression connector 700 stress relaxation of the elastomer 710 can have a direct impact on contact reliability. As discussed previously, the resistivity of the elastomer portion 710 of the force exertion member 700 is important to the overall performance of a product, such as a tape drive assembly.

In one embodiment of the present invention, the dissipative elastomer material may include a conductive material blended with the base elastomer stock and a cross-linking agent. Ketjenblack EC conductive carbon black material may be used to modify the elastomeric material 710 to provide a dissipative member. Two concentrations of carbon black have been tested: 2.5 to 3% by weight in the 50 durometer Shore A base Dow-Corning LCS-745 stock with Varox DBPH-50 peroxide to provide cross-linking of the elastomer.

The elastomer 710 with either 2.5% or 3% carbon black may still develop a charge when pressure is applied to or released. Further, this charge will be maintained if the base member 720 is insulative. Thus, an electrostatically dissipative base member 720 is also required along with a ground connection 730 to dissipate the charge generated when tension is applied to or released from the elastomer 710.

In one embodiment of the present invention, the material used for the base member 720 is procured as a custom blend from RTP Corp as RTP 799 x 100689. This is a custom blend of Ryton R-4 compound, which is polyphenylene sulfide plastic and conductive filler to provide a dissipative material for the base member 720.

Because the interface between the elastomer 710 and the base 720 is formed by vulcanization during the molding process, the interface between the elastomer 710 and the base 720 forms an excellent conductive path. It is important that both the soft rubber of the compressive member 710 and the hard plastic of the base member 720 have an appropriate conductivity. If only the soft rubber of the compressive member 710 is conductive, then the compressive member 710 will still charge up when compressed, because the charge has no means of being dissipated. The hard rubber of the base member 720 can be kept in contact with a conductive material 730 that is tied to a ground potential in order to dissipate the charge.

For use in a drive, it is also important that the conductivity of the soft rubber of the compressive member 710 be high enough to dissipate any charge build-up, but must be limited to avoid too much coupling between the multiple electrical pads 742, 752. For example, if two resistors are in parallel, e.g., $R_c$ and $R_s$, where $R_c$ is the connector resistance and $R_s$ is the sensor, a total current of $I_{total}$ through the two resistors, then the current through $R_s$, i.e., $I_s$, would be given by: $I_s = I_{total} * R_c / (R_s + R_c)$. The resistance of the combined circuit, $R_{cs}$, would be: $R_{cs} = R_c * R_s / (R_c + R_s)$. If c and s represent the connector and the sensor, then when $R_c >> R_s$ the current would predominately flow through the sensor, and the measured resistance would be that of the sensor, $R_s$. As $R_c$ decreases, less and less current will flow through the sensor and the measured resistance would decrease. Both effects could degrade the performance. Thus, with a 2.5 to 3% concentration of conductive carbon black blended into the elastomeric stock, charge build-up in/on the elastomer member 710 is minimized or eliminated while the shorting resistance between contact pads, $R_c$, is minimized so the testers used to measure resistance are not adversely affected and drive performance is not decreased.

In one embodiment of the present invention, the resistance of the base member 720 is 16.5 K-ohms when measured between the parallel plate contacting the top and bottom surfaces loaded with 0.9 kg. The elastomer member 710 with 2.5% carbon black molded into ESD base part 720 were 51 M-ohms in a similar test arrangement, and the 3% carbon filled elastomer portions 710 molded in parts in ESD base portions 720 were 3.3 M-ohms. The above measurements derived from samples having 44 elastomeric cylinders in the elastomer member 710 compressed between two parallel plates 740, 750 and loaded with 0.9 kg. The contacts 742, 752 are on a 1 mm spacing.

In one embodiment of the present invention, actual measurements of a resistor $R_s$ when the elastomer 710 is used as part of a compressive connector 700, the conductive elastomer 710 does not noticeably affect the measured resistance of $R_s$ values in the range of 10 to 45 ohms, which represent values for elements used in tape heads. The elastomer 710 does affect the resistance of elements with $R_s$ values of 900,000 ohms, dropping the resistances to around 250,000 to 450,000 when elastomers 710 with 2.5% conductive black are used and to 15,000 to 46,000 ohms when elastomers 710 with 3.0% conductive black are used. Using the relationship: $R_c = R * R_s / (R_s - R)$, one gets: $R_c$ equal to approximately 350, 000 to 900,000 ohms for 2.5% conductive black, and $R_c$ equal to approximately 15,000 to 48,000 ohms for 3% conductive black. With the steep dependence of conductivity with concentration of carbon black, increasing the concentration of carbon black much beyond 3% could begin to adversely affect performance of the circuits. Conversely, reducing the concentration to below about 2.5% carbon black would decrease the ability of the material to reliably bleed off charge built up through the addition or subtraction of pressure on the elastomer 710.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A compression connector, comprising:
   a conductive compression member having a surface for contacting a first electrical device and for compressing to applying a force normal to the surface of the compression member against the first electrical device, the compression member including a predetermined composition of conductive material and an elastomeric material; and
   an electrostatically dissipative base member including a conductive material for dissipating charge developed on the conductive compression member when the compression member compresses to apply the force to the first electrical device.

2. The compression connector of claim 1 further comprising a ground connection to dissipate the charge from the electrostatically dissipative base member that is generated when tension is applied to or released from the conductive compression member.

3. The compression connector of claim 1, wherein the resistance of the conductive compression member is selected to be higher than the resistance of the electrostatically dissipative base member.

4. The compression connector of claim 1, wherein the conductive compression member is vulcanized to the electrostatically dissipative base member.

5. The compression connector of claim 1, wherein the conductive compression member includes a conductive material blended with a base elastomer stock and a cross-linking agent.

6. The compression connector of claim 1, wherein the conductive compression material comprises conductive carbon black material.

7. The compression connector of claim 6, wherein the conductive carbon black material comprises a concentration of substantially 2.5 percent by weight of the compression member.

8. The compression connector of claim 6, wherein the conductive carbon black material comprises a concentration of substantially 3.0 percent by weight of the compression member.

9. A storage device, comprising:
   a storage element;
   an electronics assembly, operatively coupled to the storage element, for processing electrical signals for enabling storage of data on the storage element;
   a magnetic transducer;
   a cable for providing a signal path between the magnetic transducer and the electronics assembly; and
   a compression connector having electrostatic discharge dissipative properties, the compression connector compressively engaging the cable and the electronics assembly, the compression connector further comprising:
      a conductive compression member having a surface for contacting a first electrical device and for compressing to applying a force normal to the surface of the compression member against the first electrical device, the compression member including a predetermined composition of conductive material and an elastomeric material; and
      an electrostatically dissipative base member including a conductive material for dissipating charge developed on the conductive compression member when the compression member compresses to apply the force to the first electrical device.

10. The storage device of claim 9 further comprising a ground connection to dissipate the charge from the electrostatically dissipative base member that is generated when tension is applied to or released from the conductive compression member.

11. The storage device of claim 9, wherein the resistance of the conductive compression member is selected to be higher than the resistance of the electrostatically dissipative base member.

12. The storage device of claim 9, wherein the conductive compression member is vulcanized to the electrostatically dissipative base member.

13. The storage device of claim 9, wherein the conductive compression member includes a conductive material blended with a base elastomer stock and a cross-linking agent.

14. The storage device of claim 9, wherein the conductive compression material comprises conductive carbon black material.

15. The storage device of claim 14, wherein the conductive carbon black material comprises a concentration of substantially 2.5 percent by weight of the compression member.

16. The storage device of claim 14, wherein the conductive carbon black material comprises a concentration of substantially 3.0 percent by weight of the compression member.

17. A method for forming a compressive connection with electrostatic discharge dissipative properties, comprising:
   forming a conductive compression member of a predetermined composition of conductive material and an elastomeric material and having a surface for contacting a first electrical device;
   forming an electrostatically dissipative base member including a conductive material;
   compressing the compression member to apply a force normal to the surface of the compression member against the first electrical device;
   dissipating, through the electrostatically dissipative base member, a charge developed on the conductive compression member when the compression member compresses to apply the force to the first electrical device.

18. The method of claim 17, wherein the forming the conductive compression member and the electrostatically dissipative base member further comprises forming the conductive compression member with a resistance selected to be higher than a resistance of the electrostatically dissipative base member.

19. The method of claim 17, wherein the forming the conductive compression member further comprises forming the conductive compression member using a conductive carbon black material comprising a concentration of substantially 2.5 percent by weight.

20. The method of claim 17, wherein the forming the conductive compression member further comprises forming the conductive compression member using a conductive carbon black material comprising a concentration of substantially 3.0 percent by weight.

* * * * *